United States Patent
Iyechika et al.

(10) Patent No.: US 6,716,724 B1
(45) Date of Patent: Apr. 6, 2004

(54) METHOD OF PRODUCING 3-5 GROUP COMPOUND SEMICONDUCTOR AND SEMICONDUCTOR ELEMENT

(75) Inventors: Yasushi Iyechika, Matsudo (JP); Masaya Shimizu, Tsukuba (JP); Yoshinobu Ono, Ibaraki (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/337,287

(22) Filed: Jan. 7, 2003

(30) Foreign Application Priority Data

Jan. 11, 2002 (JP) .......................... 2002-004434

(51) Int. Cl.$^7$ .................. C30B 1/00; H01L 21/20; H01L 21/36
(52) U.S. Cl. .................. 438/481; 438/46; 438/975
(58) Field of Search .................. 438/46, 481, 763, 438/973, 975

(56) References Cited

U.S. PATENT DOCUMENTS 6,153,010 A * 11/2000 Kiyoku et al. ............... 117/95
6,348,096 B1    2/2002 Sunakawa et al.
6,368,733 B1 *  4/2002 Nishinaga ............... 428/698
6,503,610 B2 *  1/2003 Hiramatsu et al. ......... 428/210

FOREIGN PATENT DOCUMENTS

| JP | 10-270365 A   | 10/1998 |
| JP | 11-135770 A   | 5/1999  |
| JP | 2001-135828 A | 5/2001  |

* cited by examiner

*Primary Examiner*—Amir Zarabian
*Assistant Examiner*—Jamie L. Brophy
(74) *Attorney, Agent, or Firm*—Birch, Stewart, Kolasch & Birch, LLP

(57) ABSTRACT

In the method of producing the 3-5 group compound semiconductor carrying out the lateral direction selective growth of the desired GaN type 3-5 group compound-semiconductor layer on this c-plane by the stripe mask formed on the c-plane of the underlying crystal containing a GaN type 3-5 group compound semiconductor, a stripe mask is formed on the underlying crystal such that the direction of the stripe is rotated 0.095° or more and less than 9.6° from <1–100> direction, and with using this stripe mask, the lateral direction selective growth of the GaN type 3-5 group compound-semiconductor layer is carried out, and a high quality 3-5 group compound-semiconductor layer can be formed on the underlying crystal.

3 Claims, 4 Drawing Sheets

METHOD OF PRODUCING 3-5 GROUP COMPOUND SEMICONDUCTOR AND SEMICONDUCTOR ELEMENT

This nonprovisional application claims priority under 35 U.S.C. §119(a) on Patent Application No. 2002-004434 filed in JAPAN on Jan. 11, 2002, which is herein incorporated by reference.

BACKGROUND OF THE INVENTION

1. Field of the Invention

The present invention relates to a method of producing a gallium nitride (GaN) type 3-5 group compound semiconductor, and to a semiconductor element using the same.

2. Description of the Related Art

A GaN type 3-5 group compound semiconductor represented by the general formula $In_xGa_yAl_zN$ ($x+y+z=1$, $0 \leq x \leq 1$, $0 \leq y \leq 1$, and $0 \leq z \leq 1$) can be used as a material for an efficient light emitting device ranging from ultraviolet to visible region, since direct transition type band-gap energy can be adjusted by changing the composition of group 3 elements, so as to correspond to the optical energy of from red to ultraviolet wavelength. Further, such a 3-5 group compound semiconductor has a larger band gap than conventionally-used typical semiconductors such as Si and GaAs and, hence, keeps its semiconductor properties even at such an elevated temperature at which the conventional semiconductors cannot operate. For this reason, the 3-5 group compound semiconductors principally allow the production of electronic devices having superior environmental resistances.

However, such a compound semiconductor is difficult to grow into a large crystal because of its very high vapor pressure at around its melting point. For this reason, there has so far not been obtained a large crystal of such a compound semiconductor for practical use as a substrate to be used in the production of a semiconductor device. Thus, a compound semiconductor of this type, in general, is produced by allowing the compound semiconductor to epitaxially grow on a substrate of a material, such as sapphire or SiC, that is similar in crystal structure to the compound semiconductor and capable of providing a large crystal. At present, a relatively high-quality crystal of the compound semiconductor can be obtained by this method. Even in this case, it is difficult to reduce crystalline defects resulting from the difference in lattice constants or thermal expansion coefficients between the substrate material and the compound semiconductor and the resulting compound semiconductor generally has a defect density of about $10^8$ $cm^{-2}$ or more. In order to produce a highly efficient GaN device, a compound-semiconductor crystal having low dislocation density has been strongly demanded.

Conventionally, a method of decreasing the dislocation density has been developed in a crystal produced by heteroepitaxial growth method which uses sapphire etc. as a substrate, wherein once a mask pattern is formed on the crystal surface, and then the compound semiconductor is further re-grown. The feature of the method is to grow the compound semiconductor to a lateral direction on the mask, and this method is called Epitaxial Lateral Overgrowth (ELO) Method.

According to the above method, in the early stage of re-growth, crystal growth does not occur on the mask made of, for example, $SiO_2$ etc., but a crystal growth, so-called selective growth, occurs only through opening portions. When the crystal growth is further continued on, the crystal growth through opening portions spreads also on the mask. Thus a buried structure in which the mask is embedded is formed, and finally a flat crystal surface can be obtained. By forming the above buried structure, dislocation density in the re-grown layer can be reduced drastically compared with that in the underlying crystal.

In case of gallium nitride type 3-5 group compound semiconductor, when the above ELO method is applied, generally, a crystal growth is carried out with using c-plane as the surface, and the stripe direction of the stripe mask is generally set to <1–100> direction, in order to carry out efficiently the lateral direction growth on the mask. However, although depending on the material used as a mask, by ELO method, it has been known that the direction of c-axis of the crystal growth on the mask is misaligned from the c-axis of the underlying crystal. And in the coalescence portions of the misaligned c-axis regions, concentrated dislocation portions called a small angle tilt boundary are generated.

Thus, in the conventional ELO where the mask stripe is set to <1–100> direction, the direction of c-axis of GaN crystal grown on the mask misaligns from the c-axis of the underlying crystal, and a lot of dislocations occur in GaN layer grown on the mask. It is a big reason why the quality of the obtained 3-5 group compound semiconductor is deteriorated.

SUMMARY OF THE INVENTION

The object of the present invention is to provide a method of producing a 3-5 group compound semiconductor and a semiconductor element which can solve the above problem in the conventional technology.

The present invention provides: a method for producing a 3-5 group compound-semiconductor in which a small angle tilt boundary produced in the production of the 3-5 group compound semiconductor by a lateral direction selective growth using stripe mask is reduced in order to produce a 3-5 group compound-semiconductor of high quality and low dislocation density; and a compound-semiconductor using thereof. In order to realize the above, the fluctuation of c-axis of the 3-5 group compound semiconductor which grows thereon is reduced by rotating slightly the mask stripe direction of the mask pattern for a lateral direction selective growth from the predetermined direction, thereby, a small angle tilt boundary is reduced.

That is, in the method of producing the 3-5 group compound semiconductor carrying out the lateral direction selective growth of the desired GaN type 3-5 group compound-semiconductor layer on this c-plane by the stripe mask formed on the c-plane of the underlying crystal containing a GaN type 3-5 group compound semiconductor, a stripe mask is formed on the underlying crystal such that the direction of the stripe is rotated 0.095 or more and less than 9.6° from <1–100> direction, and with using this stripe mask, the lateral direction selective growth of the GaN type 3-5 group compound-semiconductor layer is carried out.

As above, by rotating the stripe direction of the stripe mask used for a lateral direction selective growth within the above range from predetermined <1–100> direction, the fluctuation of c-axis of the desired compound-semiconductor layer which grows selectively to lateral direction on the c-plane of the underlying crystal is reduced. Consequently, a small angle tilt boundary produced in the desired compound-semiconductor layer decreases, and a high quality 3-5 group compound-semiconductor layer can be formed on the underlying crystal.

1: 3-5 Group Compound Semiconductor
2: Sapphire Substrate
3: 1st 3-5 Group Compound-Semiconductor Layer
4: Mask Layer
5: 2nd 3-5 Group Compound-Semiconductor Layer
6: Small Angle Tilt Boundary
D: Threading dislocation
θ: Rotation angle

DETAILED DESCRIPTION OF THE INVENTION

A desired compound-semiconductor layer can be formed, for example, by a metal organic vapor phase epitaxy method or a hydride-vapor-phase-epitaxy method, and also by the other proper vapor growth method.

According to the invention, proposed is a method of producing a 3-5 group compound semiconductor comprising steps of forming a stripe mask on a underlying crystal layer containing a 3-5 group compound semiconductor represented by the general formula $In_aGa_bAl_cN$ ($0 \leq a \leq 1$, $0 \leq b \leq 1$, $0 \leq c \leq 1$, $a+b+c=1$) whose surface is c-plane, and then growing a 3-5 group compound-semiconductor layer represented by the general formula $In_xGa_yAl_zN$ ($0 \leq x \leq 1$, $0 \leq y \leq 1$, $0 \leq z \leq 1$, $x+y+z=1$) on the above underlying crystal layer, wherein said stripe mask is formed on the above underlying crystal layer with rotating the stripe direction 0.095° or more and less than 9.6° from <1–100> direction.

It is preferable that the 3-5 group compound-semiconductor layer is grown by a metal organic vapor phase epitaxy method or a hydride vapor phase epitaxy method.

The 3-5 group compound semiconductor manufactured by the process of the present invention is preferably used for a semiconductor element.

Hereinafter, embodiment of the present invention is explained in detail with reference to the drawings.

Figure 1:
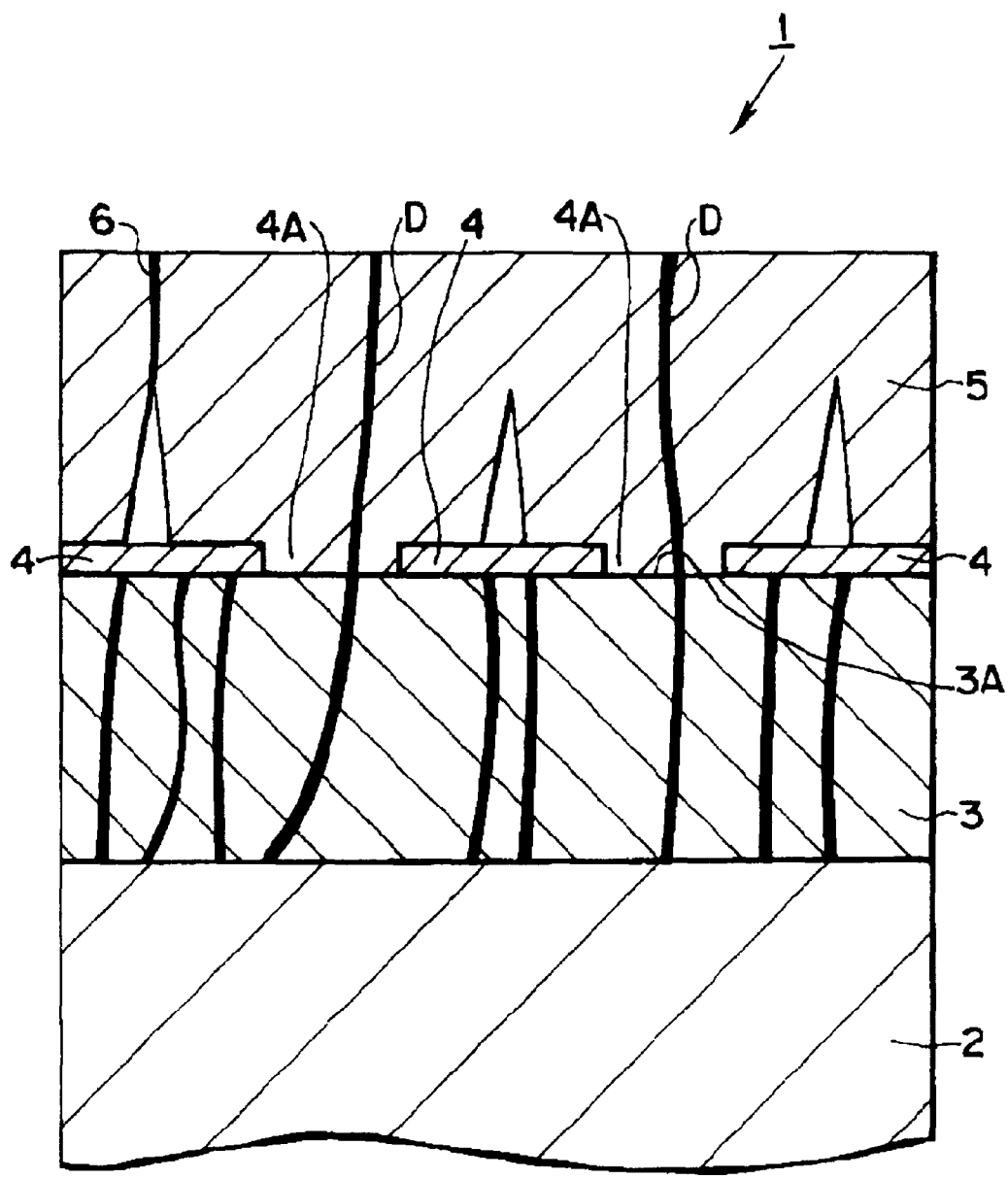
FIG. 1 is a sectional view showing schematically an example of the structure of the 3-5 group compound semiconductor manufactured by the method of the present invention.

FIG. 1 is a sectional view showing schematically an example of the structure of the 3-5 group compound semiconductor produced by the method of the present invention. In the 3-5 group compound semiconductor 1, 1st 3-5 group compound-semiconductor layer 3 as the underlying crystal is grown on the sapphire substrate 2 by MOVPE method (metal-organic vapor phase epitaxial growth method), and $SiO_2$ layer as the mask layer 4 is deposited on the 1st 3-5 group compound-semiconductor layer 3 for example by RF sputtering method. Here, the thickness of the 1st 3-5 group compound-semiconductor layer 3 is 3–4 ($\mu$m). In order to produce a good underlying crystal, two stage growing method using a known buffer layer, such as GaN, AlN, GaAlN, and SiC, is effective.

Figure 2:
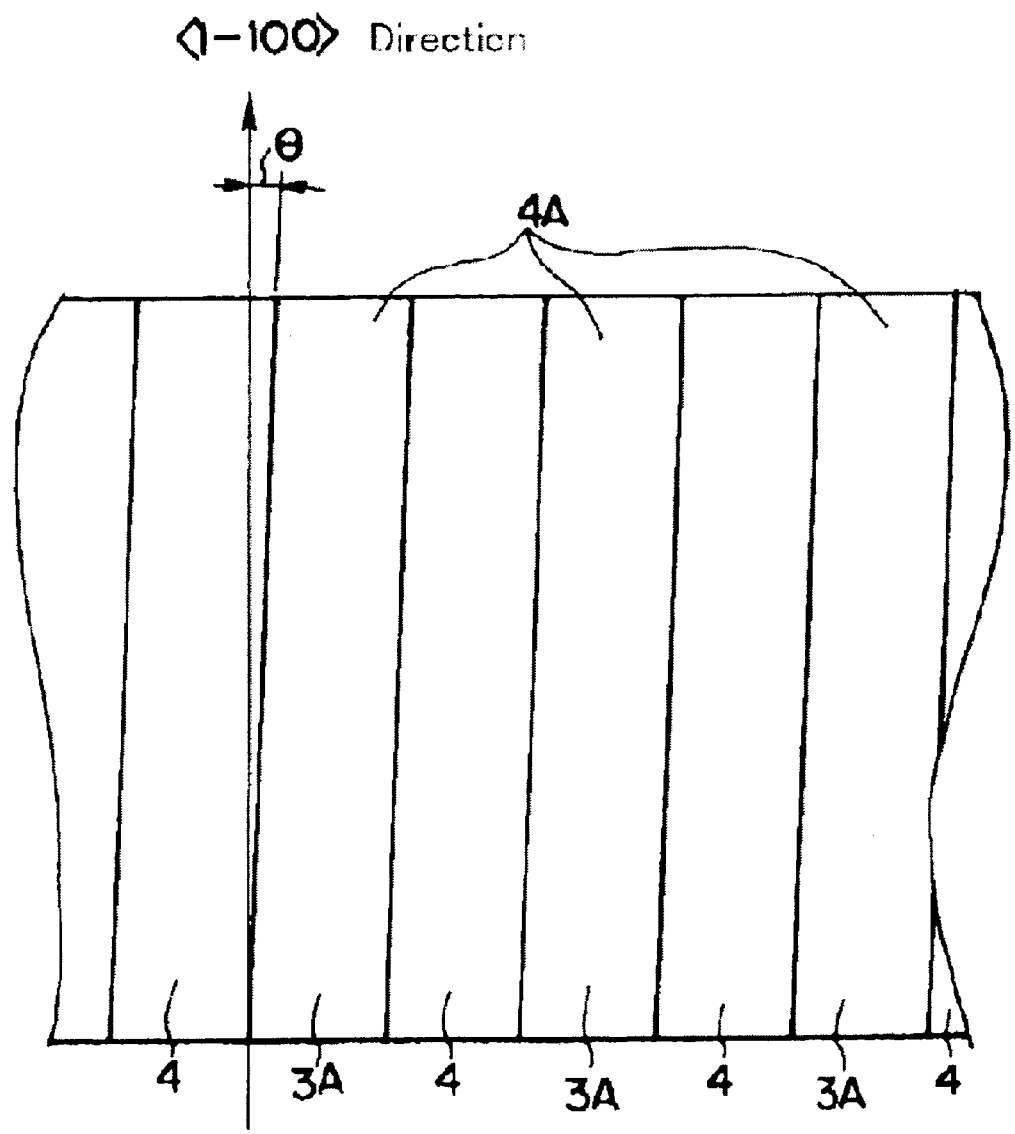
FIG. 2 is a diagram for explaining the rotation of the mask layer of the 3-5 group compound semiconductor shown in FIG. 1 from predetermined direction.

The mask layer 4, as shown in FIG. 2, is a stripe mask having window portion 4A formed on c-plane 3A of the 1st 3-5 group compound-semiconductor layer 3, and the mask layer 4 is formed on c-plane 3A, such that the direction of a stripe rotates slightly by rotation angle θ from <1–100> direction as mentioned later. In FIG. 1, the direction perpendicular to the cross-sectional plane is <1–100> direction.

As for the method of forming the mask layer 4 such that the direction of a stripe rotates slightly from <1–100> direction, a method of transferring a pattern onto the 1st 3-5 group compound-semiconductor layer 3 with rotating the photomask having stripe pattern, from <1–100> direction, can be used.

Instead, may be used a method in which adjacent stripes in the photomask having stripe pattern are formed so as not to be parallel, but to have a desired angle beforehand, and transferring this pattern. As another method, may be used a method in which adjacent stripes in the photomask having stripe pattern are formed parallel, but in zigzagged direction with a desired angle, and transferring this pattern. Of course, these methods may be combined appropriately.

In FIG. 1, the 1st 3-5 group compound-semiconductor layer 3 is GaN type 3-5 group compound-semiconductor crystal represented by the general formula $In_aGa_bAl_cN$ (here $0 \leq a \leq 1$, $0 \leq b \leq 1$, $0 \leq c \leq 1$, $a+b+c=1$). On the other hand, the mask layer 4 is formed with depositing $SiO_2$ layer in a proper thickness, and a plurality of window portion 4A are formed in slit form by photolithography.

Such window portion 4A can be formed, for example with a stripe pattern of width 5 ($\mu$m).

On the 1st 3-5 group compound-semiconductor layer 3 and the mask layer 4, the 2nd 3-5 group compound-semiconductor layer 5 represented by the general formula $In_xGa_yAl_zN$ (here $0 \leq x \leq 1$, $0 \leq y \leq 1$, $0 \leq z \leq 1$, x+y+z=1) is formed by re-growth. This 2nd 3-5 group compound-semiconductor layer 5 is formed as follows. In the early stages of growth of the 2nd 3-5 group compound-semiconductor layer 5, crystal growth does not occur on the mask layer 4, but a selective crystal growth occurs only in window portion 4A. Thus, when the crystal growth progresses, the crystal grown in window portion 4A soon spreads also on the mask layer 4, with increasing the thickness, and the growing crystalline regions which spread to the lateral direction from the both sides of the pattern join together at near the central part of pattern of the mask layer 4, and a buried structure is formed.

In a growth process of the 2nd 3-5 group compound-semiconductor layer 5 described above, generally, the direction of c-axis of the 2nd 3-5 group compound-semiconductor layer 5 produces misalignment with the c-axis of the 1st 3-5 group compound-semiconductor layer 3, and a small angle tilt boundary 6 may occur in the coalescence portion of the growth crystalline regions which spread to the lateral direction from the both sides of the pattern of the mask layer 4.

However, since the mask layer 4 is formed such that the stripe direction is rotated to rotation angle e from <1–100> direction, the fluctuation of c-axis of the 2nd 3-5 group compound-semiconductor layer 5 growing selectively to the lateral direction on the 1st 3-5 group compound-semiconductor layer 3, thus, generation of a small angle tilt boundary can be stopped effectively on the coalescence portion.

In the example of FIG. 1, the 2nd 3-5 group compound-semiconductor layer 5 is formed by a lateral direction selective growth as above. Accordingly, among a large number of the dislocation produced in the underlying crystal of the 1st 3-5 group compound-semiconductor layer 3, only threading-dislocation D which is not terminated by the mask layer 4, but penetrated window portion 4A is taken over in the 2nd 3-5 group compound-semiconductor layer 5. As above, by forming the 2nd 3-5 group compound-semiconductor layer 5, in the 2nd 3-5 group compound-semiconductor layer 5 on the mask layer 4, the mask layer 4 terminates the dislocation of the 1st 3-5 group compound-semiconductor layer 3, and the dislocation does not occur in the 2nd 3-5 group compound-semiconductor layer 5 thereon, thus, the dislocation density in the 2nd 3-5 group compound-semiconductor layer 5 can be reduced. When the 2nd 3-5 group compound-semiconductor layer 5 is grown, a facet is formed, and the propagation of threading-dislocation D in the 2nd 3-5 group compound-semiconductor layer 5 is controlled according to the forming mode of the facet, thus, threading-dislocation D can also be made not to arrive at the surface of the 2nd 3-5 group compound-semiconductor layer 5.

As the method of the film forming for manufacturing the 3-5 group compound semiconductor 1, a molecular beam epitaxy (hereafter may be referred to as MBE) method, MOVPE method, and HVPE method are exemplified. The MBE method is important as the method is suitable for producing a laminated structure having a sharp interface. The MOVPE method is important as it is suitable for forming a laminated structure having a sharp interface, and also for producing a uniform film of large area. The HVPE method can produce a crystal with few impurities in large film-forming speed, and it is important. When the HVPE method is used for growing the 2nd 3-5 group compound-semiconductor layer 5, a large growth rate can be obtained, and a good crystal can be produced in a short time.

As above, the stripe direction of the mask layer 4 is slightly rotated from <1–100> direction. It is preferable that this rotation angle θ, is set to an angle in which one step (a-axis length) of <11–20> direction perpendicular to the mask pattern direction is contained at a rate of one per 6 to 600 times of the a-axis length. That is, generation of a small angle tilt boundary can be effectively stopped by setting rotation angle θ of the mask layer 4 to 0.095° or more and less than 9.6° from <1–100> direction. More preferably, the rotation angle is 1° or more and 5° or less, most preferably 1° or more and 3° or less.

When the direction of a stripe of the mask layer 4 is rotated slightly as described above, the fluctuation of c-axis of the 2nd 3-5 group compound-semiconductor layer 5, which grow selectively to lateral direction on c-plane 3A of the 1st 3-5 group compound-semiconductor layer 3, reduces. By this, generation of a small angle tilt boundary 6 in the coalescence portion of the 2nd 3-5 group compound-semiconductor layer 5 of just above the mask layer 4 can be stopped, and a high quality of the 2nd 3-5 group compound-semiconductor layer 5 can be produced.

As a result of various experimental studies, when rotation angle θ of a stripe direction of the mask layer 4 from <1–100> direction is less than 0.095°, the reduction of a small angle tilt boundary could not be confirmed. Moreover, when the rotation angle θ is 9.6° or more, a good buried structure could not be obtained. That is, it was confirmed by experimentals that rotation angle θ of a stripe direction of the mask layer 4 from <1–100> direction should be 0.095° or more and less than 9.6°.

The following experiments were conducted in order to check the improvement of the generation of a small angle tilt boundary by the rotation of a stripe direction of the mask layer 4 from <1–100> direction.

3 μm thickness of GaN layer was formed by MOVPE method on a 2 inch sapphire wafer, and the mask layer of a stripe shape of 5 μm width and 5 μm spacing pattern was formed all over the surface. Film formation of a GaN layer was further carried out by MOVPE method on this substrate in 6 μm, 1020° C., and ½ atmospheric pressure, and the buried structure was obtained. And the rocking curve by (0004) at the time of rotating slightly the direction of a stripe of this mask layer from <1–100> direction was evaluated.

Figure 3:
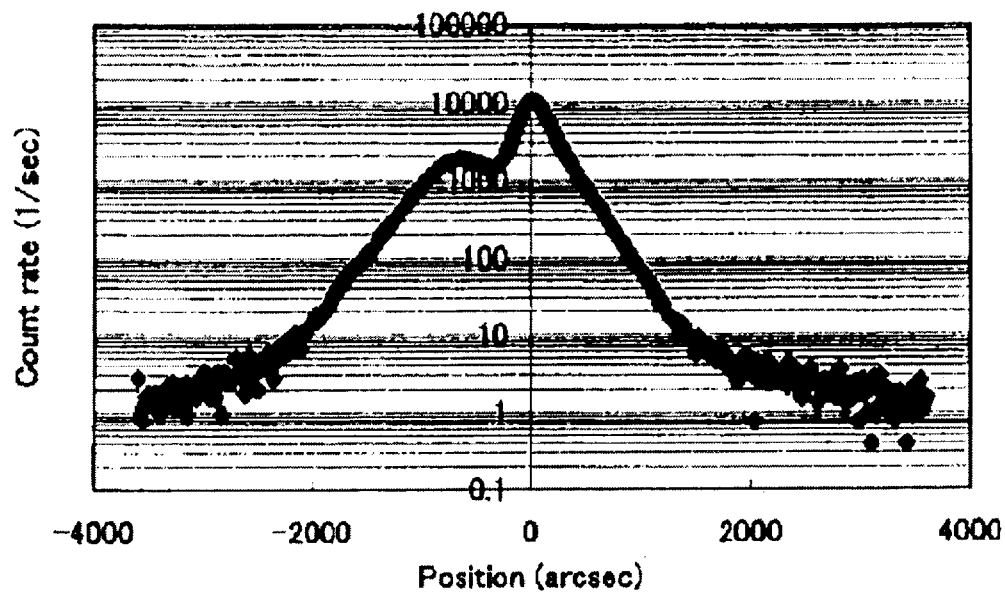
FIG. 3 is a graph showing the measurement result of the rocking curve, when rotation angle of the stripe of a mask layer is 1°.
Figure 4:
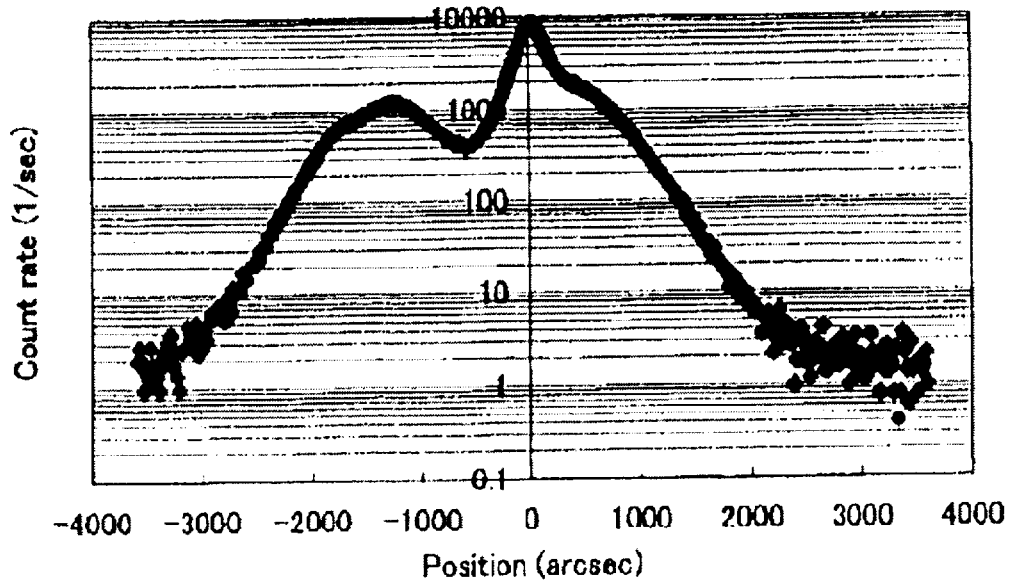
FIG. 4 is a graph showing the measurement result of the rocking curve, when rotation angle of the stripe of a mask layer is 3°.
Figure 5:
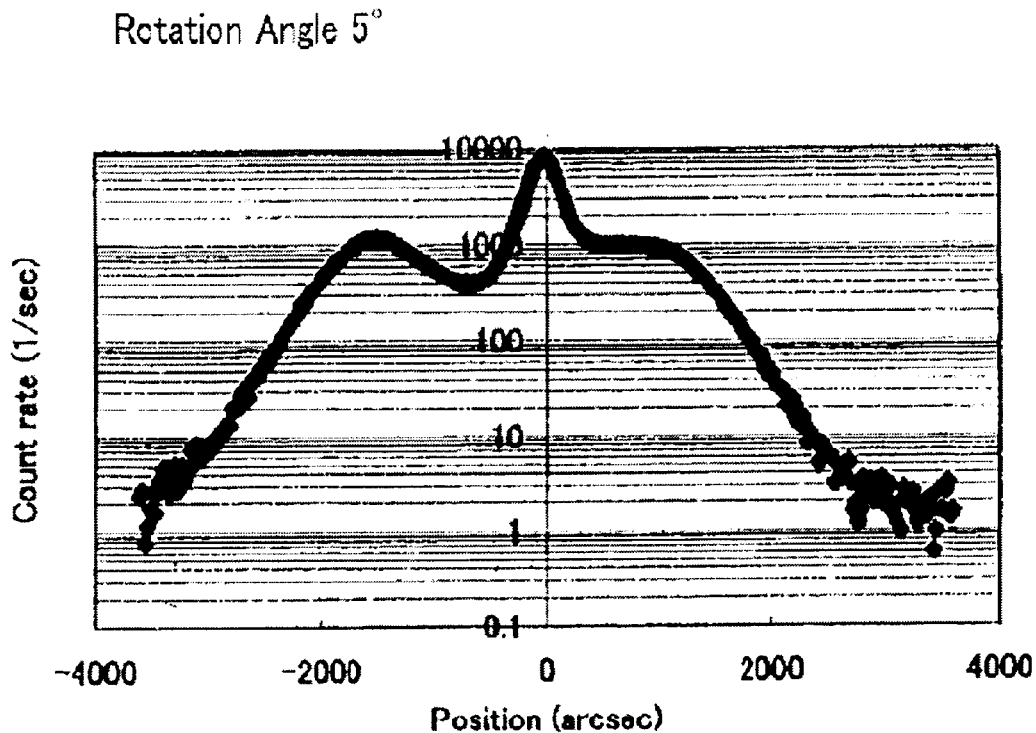
FIG. 5 is a graph showing the measurement result of the rocking curve, when rotation angle of the stripe of a mask layer is 5°.
Figure 6:
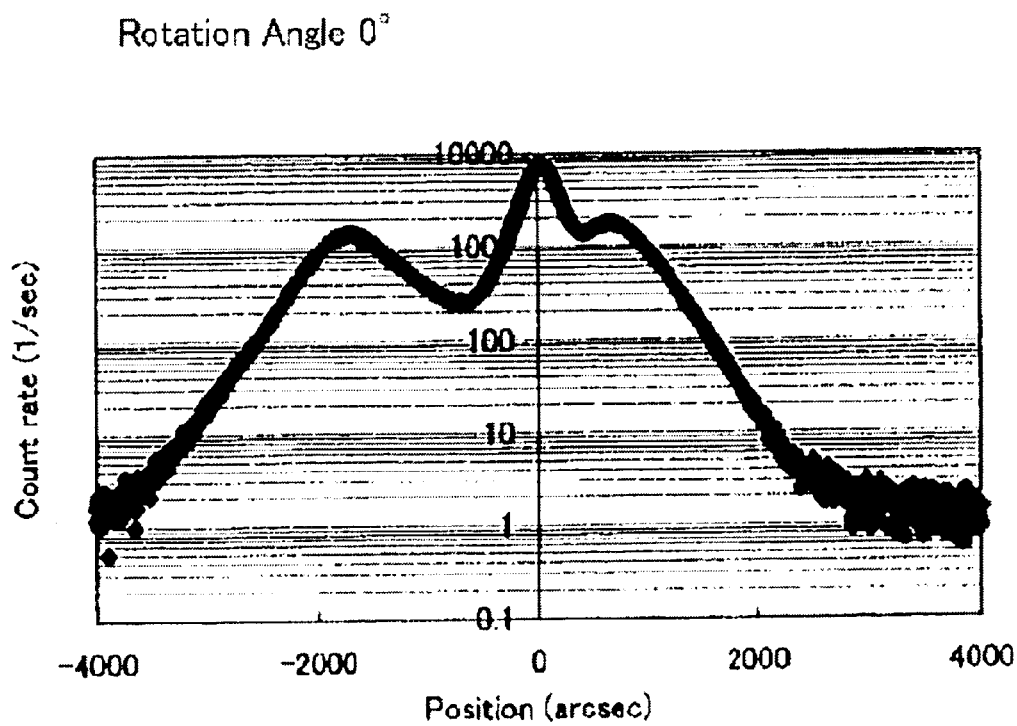
FIG. 6 is a graph showing the measurement result of the rocking curve, when rotation angle of the stripe of a mask layer is 0°.

Measurement results in case of the above rotation angle θ of the mask layer, 1°, 3°, and 5° were evaluated with the comparative example whose rotation angle θ is 0°. FIG. 3, FIG. 4, and FIG. 5, show the measurement results in case that rotation angle θs are 1°, 3°, and 5°, respectively. FIG. 6 shows the measurement result of the comparative example whose rotation angle θ is 0°.

In the each case where X-ray is entered in the direction of a stripe of a mask layer, a pattern of a single peak was shown, and the half band width was about 250 arcsec. On the other hand, when the X-ray was entered from a direction perpendicular to the direction of the stripe of a mask layer, in the examples produced here, when rotation angle θ was 0°, the main peaks and two side peaks of the both sides were observed. The half width of the main peak was about 250 arcsec, and it was almost the same with that of the underlying substrate. When the direction of the stripe was gradually rotated from <1–100>, the peak at the high angle side becomes weak, compared with the case without rotation. Especially, it was remarkable when rotation angle θs were 1° and 3°. Since the strength of a side peak was lowered by rotating the direction of a stripe, it is considered that the generation of a small angle tilt boundary is suppressed. A good semiconductor element can be obtained using this substrate.

According to the present invention, described as above, generation of a small angle tilt boundary can be reduced very effectively only by rotation the stripe mask formed on the c-plane of an underlying crystal 0.095° or more and less than 9.6° from the predetermined direction <1–100> for a lateral direction selective growth. Consequently, good crystalline GaN compound semiconductor can be produced without significant cost rising. Moreover, a semiconductor element having a good electrical property, can be produced at low cost by this manufacture method.

What is claimed is:

1. A method of producing a 3-5 group compound semiconductor comprising the steps of forming a stripe mask on an underlying crystal layer containing a 3-5 group compound semiconductor represented by general formula $In_aGa_bAl_cN$ ($0 \leq a \leq 1$, $0 \leq b \leq 1$, $0 \leq c \leq 1$, $a+b+c=1$) whose surface is c-plane, and then growing a, second 3-5 group compound-semiconductor layer represented by the general formula $In_xGa_yAl_zN$ ($0 \leq x \leq 1$, $0 \leq y \leq 1$, $0 \leq z \leq 1$, $x+y+z=1$) on the underlying crystal layer, wherein said stripe mask is formed on the underlying crystal layer with rotating the stripe direction 0.095° or more and less than 9.6° from <1–100> direction.

2. The method of producing a 3-5 group compound semiconductor according to claim 1, wherein the second 3-5 group compound-semiconductor layer is grown by a metal organic vapor phase epitaxy method or a hydride vapor phase epitaxy method.

3. A semiconductor element using the 3-5 group compound semiconductor produced by the method of claim 1 or 2.

* * * * *